(12) United States Patent
Card et al.

(10) Patent No.: US 7,547,577 B2
(45) Date of Patent: Jun. 16, 2009

(54) METHOD OF MAKING CIRCUITIZED SUBSTRATE WITH SOLDER PASTE CONNECTIONS

(75) Inventors: Norman A. Card, Lockwood, NY (US); Thomas R. Miller, Endwell, NY (US); William J. Rudik, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 201 days.

(21) Appl. No.: 11/598,647

(22) Filed: Nov. 14, 2006

(65) Prior Publication Data

US 2008/0110016 A1    May 15, 2008

(51) Int. Cl.
*H01L 21/44* (2006.01)

(52) U.S. Cl. .................. 438/108; 438/106; 438/107; 438/113; 438/114; 438/118; 257/E21.511

(58) Field of Classification Search ................ 438/114, 438/119, 59
See application file for complete search history.

(56) References Cited

U.S. PATENT DOCUMENTS

| | | | |
|---|---|---|---|
| 4,818,728 A * | 4/1989 | Rai et al. | 438/108 |
| 5,026,624 A | 6/1991 | Day et al. | |
| 5,132,351 A * | 7/1992 | Goldberg et al. | 524/403 |
| 5,300,402 A | 4/1994 | Card, Jr. et al. | |
| 5,324,569 A * | 6/1994 | Nagesh et al. | 428/198 |
| 6,138,350 A | 10/2000 | Bhatt et al. | |
| 6,365,973 B1 * | 4/2002 | Koning | 257/772 |
| 6,388,204 B1 | 5/2002 | Lauffer et al. | |
| 6,440,542 B1 | 8/2002 | Kariya | |
| 6,504,111 B2 | 1/2003 | Curcio et al. | |
| 6,593,534 B2 | 7/2003 | Jones et al. | |
| 6,638,607 B1 | 10/2003 | Curcio et al. | |
| 6,742,247 B2 * | 6/2004 | Pai et al. | 29/829 |
| 6,809,269 B2 | 10/2004 | Fuller, Jr. et al. | |
| 6,815,837 B2 | 11/2004 | Alcoe | |
| 6,828,514 B2 | 12/2004 | Chan et al. | |
| 6,955,849 B2 | 10/2005 | Curcio et al. | |

* cited by examiner

*Primary Examiner*—N Drew Richards
*Assistant Examiner*—Kyoung Lee
(74) *Attorney, Agent, or Firm*—Mark Levy; Lawrence R. Fraley; Hinman, Howard & Kattell

(57) ABSTRACT

A method of making a circuitized substrate assembly in which two or more subassemblies are aligned and bonded together. The bonding, preferably using lamination, results in effective electrical connections being formed between respective pairs of conductors of the subassemblies in such a manner that the metallurgies of the conductors, and those of an interim metallic solder paste, are effectively mixed and the flowable interim dielectric used between the mating subassemblies is forced to flow to engage and surround the conductor coupling, without adversely affecting the electrical connection formed.

18 Claims, 2 Drawing Sheets

METHOD OF MAKING CIRCUITIZED SUBSTRATE WITH SOLDER PASTE CONNECTIONS

TECHNICAL FIELD

This invention relates to organic circuitized substrates and particularly to those used for multilayered circuit boards, chip carriers, and the like. Even more particularly, the invention relates to the formation of such multilayered structures in which two or more circuitized subassemblies are formed and then bonded to each other.

BACKGROUND OF THE INVENTION

As is known, multilayered printed circuit boards (PCBs), laminate chip carriers, and the like organic products permit formation of multiple circuits in a minimum volume or space. These typically comprise a stack of electrically conductive layers of signal, ground and/or power planes separated from each other by a layer of organic dielectric material. The planes may be in electrical contact with each other by plated holes passing through the dielectric layers. The plated holes are often referred to as "vias" if internally located, "blind vias" if extending a predetermined depth within the board from an external surface, or "plated-thru-holes" (PTHs) if extending substantially through the board's full thickness. By the term "thru-hole" as used herein is meant to include all three types of such board openings.

Today's methods for fabricating such PCBs, chip carriers and the like typically comprise fabrication of separate inner-layer circuits (circuitized layers), which are formed by coating a photosensitive layer or film over a copper layer of a copper clad inner-layer base material bonded (e.g., laminated) to a dielectric layer. The organic photosensitive coating is imaged, developed and the exposed copper is etched to form conductor lines, pads and the like, depending on the desired circuit pattern. After etching, the photosensitive film is stripped from the copper leaving the circuit pattern on the surface of the inner-layer base material. This processing is also referred to as photolithographic processing in the PCB art and further description is not deemed necessary. Following the formation of individual inner-layer circuits, each including at least one conductive layer and supporting dielectric layer, a multilayer "stack" (assembly) is formed by preparing a lay-up of several inner-layers, ground planes, power planes, etc., typically separated from each other by a dielectric, organic pre-preg typically comprising a layer of glass (typically fiberglass) cloth impregnated with a partially cured material, typically a B-stage epoxy resin. Such an organic material is also referred to in the industry as "FR-4" dielectric material. The top and bottom outer layers of the stack usually comprise copper clad, glass-filled, epoxy planar substrates with the copper cladding comprising exterior surfaces of the stack. The stack is laminated to form a monolithic structure (assembly) using heat and pressure to fully cure the B-stage resin. The stacked assembly so formed typically has metal (usually copper) cladding on both of its exterior surfaces. Exterior circuit layers are formed in the copper cladding using procedures similar to the procedures used to form the inner-layer circuits. A photosensitive film is applied to the copper cladding and the coating is then exposed to patterned activating radiation and developed. An etching solution such as cupric chloride is then used to remove copper bared by the development of the photosensitive film. Finally, the remaining photosensitive film is removed to provide the exterior circuit layers. The resulting assembly may include as many as thirty or more conductive layers and a corresponding number of dielectric layers, all laminated into the final stacked assembly in a simultaneous manner using conventional lamination processes.

Rather than form a large assembly comprising several individual conductive-dielectric layered members, as described above, it is often desirable to initially form a stacked circuitized substrate "subassembly" including two or more conductive layers and associated dielectric layers, the laminated subassembly including a plurality of conductor pads (e.g., copper) on one or both external surfaces. These pads are often formed using photolithographic processing, as mentioned above. Two or more such subassemblies are then aligned and laminated, using an interim organic pre-preg layer such as described above, to form a final multilayered assembly. Additional individual conductor planes and dielectric layers may be included during the lamination to form even more layers for the final assembly.

In such a subassembly type of process, it is necessary to provide interconnections between the various subassemblies. This is accomplished in one manner by aligning the respective outer conductor pads on one subassembly with those on another and then bringing the two together using conventional lamination procedures. The two subassemblies are separated before lamination by an interim dielectric layer, preferably a conventional pre-preg. This dielectric serves to insulate various external conductive elements (e.g., signal lines) of one subassembly from another while allowing the designated aligned pairs of conductor pads to mate and form an electrical connection. A conductive solder paste may be used between the two mating pads to enhance the connection.

For assemblies and subassemblies as defined above, electrically conductive thru-holes (or interconnects) may also be used to electrically connect individual circuit layers and may be of one or more of the three types (buried and blind vias, and PTHs) of connections defined above. If such thru-holes are used, the bare hole walls are usually subjected to at least one pre-treatment step after which the walls of the dielectric material are catalyzed by contact with a plating catalyst and metallized, typically by contact with an electro-less or electrolytic copper plating solution. If the thru-holes are PTHs (those which extend through the entire assembly or subassembly), interconnections are thus formed between selected ones of the circuitized layers. Connectivity between aligned thru-holes of mating subassemblies is accomplished preferably using a conductive paste or the like. Such pastes are known to include a highly conductive metal such as silver in the form of flakes.

Following construction of the final multilayered assembly, chips and/or other electrical components are then mounted at appropriate locations on the exterior circuit layers of the assembly. In some examples, such components are mounted and electrically coupled using solder ball technology, one form of which is referred to in the industry as ball grid array (BGA) technology. For PCB's, these components may include capacitors, resistors, and even chip carriers. For chip carriers, a chip is often solder bonded to the carrier laminate substrate's upper surface and the carrier is in turn solder bonded to an underlying "host" substrate, typically a PCB. In either form (PCB or chip carrier), the components are in electrical contact with the circuits within the structure through the conductive thru-holes and the coupled pairs of pads (if the assembly is formed using subassemblies as mentioned), as desired. The external solder pads of the assembly designed to receive such components are typically formed by applying an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the exterior surfaces and exposed and developed to yield an array of openings defining the pads. The openings are then coated with solder using processes known to the art such as wave soldering. Examples of products such as defined above are shown in the patents listed below. The listing thereof is not an admission that any are prior art to the present invention.

In U.S. Pat. No. 6,138,350, there is described a process for manufacturing circuit boards comprising providing a circuitized substrate having a dielectric surface, providing a peel apart structure including a metal layer and a peelable film, laminating the peel apart structure to the circuitized substrate with the metal layer positioned adjacent the dielectric surface, forming holes in the circuitized substrate through the peel apart structure, applying a filler material including an organic base to the peel apart structure, applying a sacrificial film onto the filler material, and applying sufficient heat and pressure to the sacrificial film to force the filler material into the holes to substantially fill the holes.

In U.S. Pat. No. 6,388,204, there is described a laminate circuit structure assembly that comprises at least two modularized circuitized plane subassemblies; a joining layer located between each of the subassemblies and wherein the subassemblies and joining layer are bonded together with a cured dielectric from a bondable, curable dielectric. The subassemblies and joining layer are electrically interconnected with bondable electrically conductive material. The joining layer comprises dielectric layers disposed about an internal electrically conductive layer. The electrically conductive layer has a via and the dielectric layers each have a via of smaller diameter than the vias in the electrically conductive layer and are aligned with the vias in the electrically conductive layer. The vias are filled with electrically bondable electrically conductive material for providing electrical contact between the subassemblies.

In U.S. Pat. No. 6,440,542, there is described a copper-clad laminate which includes an insulative substrate having laminated on one or either side thereof a copper foil in which one side is roughened, the copper foil having formed on the roughened surface side thereof a metal layer whose melting point is lower than that of zinc. There is also provided a circuit board including an insulative substrate having a conductive circuit formed on one side thereof and via holes extending from the other side of the insulative substrate to the conductive circuit, there being formed between the one side of the insulative substrate and the conductive circuit a metal layer whose melting point is lower than that of zinc. No de-smearing is apparently required in making the circuit board.

In U.S. Pat. No. 6,504,111, there is described a structure for providing an interconnect between layers of a multilayer circuit board. The structure comprises a stack that includes at least one layer and a via opening that extends through at least one layer of the stack. Each individual via opening is filled with a solid conductive plug and each solid conductive plug has a first contact pad and a second contact pad.

In U.S. Pat. No. 6,593,534, there is described a method for producing a multilayer printed or wiring circuit board, and more particularly a method producing so-called z-axis or multilayer electrical interconnections in a hierarchical wiring structure in order to be able to provide for an increase in the number of inputs and outputs (I/O) in comparison with a standard printed circuit board arrangement.

In U.S. Pat. No. 6,638,607, there is described a method of forming a member for joining to form a composite wiring board. The member includes a dielectric substrate. Adhesive tape is applied to at least one face of this substrate. At least one opening is formed through the substrate extending from one face to the other and through each adhesive tape. An electrically conductive material is dispensed in each of the openings and partially cured. The adhesive tape is removed to allow a nub of the conductive material to extend above the substrate face to form a wiring structure with other elements.

In U.S. Pat. No. 6,809,269, there is defined a circuitized substrate assembly and method for making same wherein the assembly includes individual circuitized substrates bonded together. The substrates each include at least one opening, only one of which is substantially filled with a conductive paste prior to bonding. Once bonded, the paste is also partially located within the other opening to provide an effective electrical connection therewith. One example of a product using this technology is a chip carrier. This patent is also assigned to the same Assignee as the instant invention.

In U.S. Pat. No. 6,815,837, there is defined an electronic package (e.g., a chip carrier) and information handling system utilizing same wherein the package substrate includes an internally conductive layer coupled to an external pad and of a size sufficiently large enough to substantially prevent cracking, separation, etc. of the pad when the pad is subjected to a predetermined tensile pressure. This patent is also assigned to the same Assignee as the instant invention.

In U.S. Pat. No. 6,828,514, there is defined a multilayered PCB including two multilayered portions, one of these able to electrically connect electronic components mounted on the PCB to assure high frequency connections there-between. The PCB further includes a conventional PCB portion to reduce costs while assuring a structure having a satisfactory overall thickness for use in the PCB field. Coupling is also possible to the internal portion from these components. This patent is assigned to the same Assignee as the instant invention.

In U.S. Pat. No. 6,955,849, there is described a method for producing small pitch z-axis electrical interconnections in layers of dielectric materials which are applied to printed circuit boards and diverse electronic packages. The method involves parallel fabrication of intermediate structures which are subsequently jointed to form a final structure. In addition there is provided a z-interconnected electrical structure, employing dielectric materials such as resin coated copper, employable in the manufacture of diverse type of electronic packages, including printed circuit boards, multi-chip modules and the like.

Complexity of the above organic products (those including organic dielectric layers, including the aforementioned PCB's and laminate chip carriers) has increased significantly over the past few years. For example, PCBs for mainframe computers may have as many as thirty-six layers of circuitry or more, with the complete assembly having a thickness of as much as about 0.250 inch (250 mils). Laminate chip carriers, in turn, may have as many as fifteen circuit layers or more as part thereof. Such organic products are known with three to five mil (a mil being one thousandth of an inch) wide signal lines and twelve mil diameter thru-holes. For increased circuit densification in many of today's products, the industry is attempting to reduce signal lines to a width of two mils or less and thru-hole diameters to two mils or less. Such high densification understandably mandates the most efficient means of interconnecting the conductor pads of the respective subassemblies when using such subassemblies to form a final multilayered circuitized substrate assembly. As defined herein, the present invention is able to accomplish this.

It is believed that a method of making a circuitized substrate assembly having organic dielectric material as part thereof which is able to assure sound, effective interconnections between various parts (subassemblies) thereof would constitute a significant advancement in the art.

OBJECTS AND SUMMARY OF THE INVENTION

It is, therefore, a primary object of the invention to enhance the circuitized substrate art.

It is another object of the invention to provide a method of making a circuitized substrate assembly in which conductor pads of at least two circuitized substrate subassemblies are joined together in a new and unique manner, assuring a sound electrical connection between the joined pads and thus the two subassemblies.

It is another object of the invention to provide such a method as defined above in which lamination is utilized as part of the subassembly bonding process.

According to one aspect of the invention, there is provided a method of making a circuitized substrate assembly comprising providing first and second circuitized substrate subassemblies, each subassembly including at least one dielectric layer and at least one conductive layer including a plurality of metallic conductor pads as part thereof, aligning the first and second circuitized substrate subassemblies relative to one another such that each of the metallic conductor pads of the first circuitized substrate subassembly are aligned with a corresponding metallic conductor pad of the second circuitized substrate subassembly in a facing manner, positioning a flowable dielectric layer between the first and second circuitized substrate subassemblies, this flowable dielectric layer including a plurality of openings therein, each opening aligning with a respective pair of aligned and facing metallic conductor pads, depositing a quantity of metallic solder paste on at least one of the metallic conductor pads of each of said pairs of aligned and facing metallic conductor pads, bonding the first and second circuitized substrate subassemblies together using heat and pressure in such a manner that the metallurgies of the solder paste and metallic conductor pads are combined to form an electrical connection therebetween and the material of said flowable dielectric layer will flow into said openings to substantially fill said openings and physically contact and surround said electrical connections without adversely affecting said electrical connections.

BEST MODE FOR CARRYING OUT THE INVENTION

Figure 1:
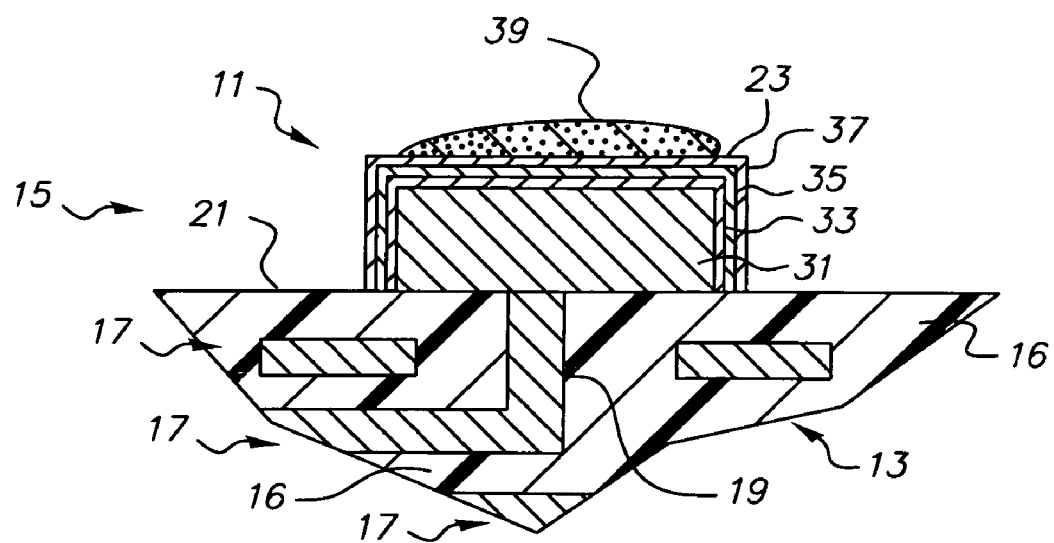
FIG. 1 is a much enlarged, side elevational view, in section, of a metallic conductor pad mounted on a substrate and including a quantity of metallic solder paste thereon in accordance with one embodiment of the invention.

For a better understanding of the present invention, together with other and further objects, advantages and capabilities thereof, reference is made to the following disclosure and appended claims in connection with the above-described drawings. Like figure numbers will be used from FIG. to FIG. to identify like elements in these drawings.

By the term "circuitized substrate subassembly" as used herein is meant to include a substrate structure having at least one (and preferably more) dielectric layer(s) and at least one external conductive layer positioned on the dielectric layer and including a plurality of conductor pads as part thereof. The dielectric layer(s) may be made of one or more of the following dielectric materials: fiberglass-reinforced epoxy resin ("FR-4"), polytetrafluoroethylene (Teflon), polyimide, polyamide, cyanate resin, photo-imageable material, and other like materials. One example of such material known today is sold under the product name "RO2800" by Rogers Corporation, Rogers, Conn. ("RO2800" is a trademark of the Rogers Corporation.) The conductive layer(s) preferably serves as a signal layer to conduct electrical signals, including those of the high frequency type, and is preferably comprised of suitable metals such as copper, but may include or comprise additional metals (e.g., nickel, aluminum, etc.) or alloys thereof. Further examples will be described in greater detail herein-below. An example of one type of photo-imageable dielectric is ASMDF (Advanced Soldermask Dry Film). This composition, which is further described in U.S. Pat. No. 5,026,624, which issued Jun. 25, 1991, and U.S. Pat. No. 5,300,402, which issued Apr. 25, 1994, includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from the 3M Company (having a place of business at 305 Sawyer Ave., Tonawanda, N.Y.); 3.85% Aerosil 380, an amorphous silicon dioxide from Degussa Corporation (having a business location at Interspace Parkway, Parsippany, N.J.), to provide the solid content. A solvent is present from about 11 to about 13.5% of the total photo-imageable dielectric composition.

By the term "circuitized substrate assembly" as used herein is meant to include a multilayered structure comprised of two or more such circuitized substrate subassemblies which are separately formed and bonded together. Additional dielectric and conductive layers may also be added to this final structure.

By the term "electrical assembly" is meant at least one circuitized substrate assembly as defined herein in combination with at least one electrical component (defined below) electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Another example is a printed circuit board.

By the term "electrical component" as used herein is meant components such as semiconductor chips and the like which are adapted for being positioned on the external-conductive surfaces of circuitized substrates (to thus define a circuitized substrate assembly) and electrically coupled to the substrate for passing signals from the component into the substrate whereupon such signals may be passed on to other components, including those mounted also on the substrate, as well as other components such as those of a larger electrical system which the assembly forms part of.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers, computer mainframes, etc.

FIG. 1 illustrates one embodiment of a metallic electrical conductor 11 of the invention, the conductor positioned atop a circuitized substrate 13 to form a circuitized substrate subassembly 15. Substrate 13 is preferably of conventional dielectric material 16 (as defined above) and may include one or more conductive layers 17 therein (three such layers are shown in FIG. 1). Each conductive layer may be a signal, power or ground layer, depending on the operational requirements for subassembly 15 and the final circuitized substrate assembly (not shown) which subassembly 15 will form part of. As many as thirty internal conductive layers may be formed as part of the subassembly, and a corresponding number of dielectric layers utilized to electrically isolate one conductive layer from another in the stacked orientation such as that shown. Such a subassembly may have a thickness of from about twelve mils (a mil being one thousandths of an inch) to about 150 mils. Each conductive layer may have a thickness of from only about two mils to as much as twenty-five mils, depending on its function with the subassembly. Conductor 11 may be electrically coupled to one or more of the internal conductive layers (i.e., using a conductive thruhole 19 (in this case, a "blind via") as defined above), and is particularly shown in FIG. 1 as coupled to the second layer from the substrate's upper surface 21. Subassembly 15 is understood to include more than one conductor 111 to accommodate the many signal paths desired for products utilizing same. In one embodiment, the subassembly may include as many as 1500 conductors 111 on its upper surface. Only one is shown in FIG. 1 for ease of illustration and it is understood that remaining conductors are positioned in a spaced relationship relative to each other, and in a pre-determined pattern (e.g., rectangular) on the upper surface 21.

In one embodiment, conductor 11 may have a height of from only about 0.1 mils to about 6.5 mils, and be of a substantially cylindrical configuration with a flat upper surface 23. The conductors are preferably formed from a single sheet of copper which is bonded (e.g., laminated) to the upper surface of the underlying dielectric 16 and then subjected to conventional photolithographic processing used in the PCB art for defining circuit patterns and elements. Such processing is described above and further description is not considered necessary. In its simplest form, conductor 11 may comprise a singular metal member 31, preferably copper or copper alloy, having a cylindrical configuration as mentioned. In another embodiment, the conductor may include one or more additional layers of metal formed (e.g., plated) thereon. In one such example, member 31 may include a first layer 33 of nickel and a second layer 35 of gold. In yet another embodiment, the member 31 may simply include a thin outer layer of solder 37. It is also possible to include the nickel, gold and solder layers on the base member 31, in the order shown in FIG. 1 (the invention is thus not limited to the particular arrangement depicted in FIG. 1). A known (also referred to as a "eutectic") solder is preferably utilized for layer 37, this solder including about sixty-three percent tin and thirty-seven percent lead, by weight. Preferably, the lead content will comprise about fifty percent by weight or less of the composition. Other solders may be used, however, including the more recently developed lead-free solders. In this example, in which the member 31 may have a thickness of from about 0.1 mil to about three mils, the nickel layer 33 is preferably from about 0.1 mil to about 1.5 mils, the gold layer is from about 0.1 mil to about 0.5 mil, and the outer solder layer 37 is from about 0.1 mil to about three mils thick. These thicknesses, and the particular metallurgies defined, serve to promote a sound mix between said metallurgies and similar metallurgies of a mating conductor (as defined below), as well as those in the coupling metallic solder paste used, when forming the assembly of the invention. As understood, all conductors 11 of the subassembly will include such metals and thicknesses, if same are selected for this particular embodiment. Other metallurgies, e.g., silver for the gold or in combination therewith, and thicknesses are also possible. The nickel in the above combination serves as an adherence promoting layer for the subsequently applied gold, which is a well known precious metal of exceptional conductivity. The tin-lead solder layer serves to enhance the flowing of the solder paste (defined below) when bonding with another conductor is begun. The nickel and gold layers are preferably applied using an electroplating process, either electroless plating or electrolytic plating being acceptable for this purpose. Solder layer 37 is preferably applied by depositing a quantity of solder paste (using a conventional screen printing operation) onto each of the pads and then re-flowing it. Layer 37 may also be applied by electroplating, or by using a stencil printing process, if desired. Further description is provided below for the re-flow procedure. Electroplating processes are known and additional definition is not considered necessary.

In a preferred embodiment of the invention, pad member 31 is comprised of copper or copper alloy and includes the above identified layer of solder 37, sans the interim nickel and gold layers. In this embodiment, the pad has a height of from about two to about 2.5 mils. The screen-deposited solder 37 is then subjected to the above mentioned re-flow process such that it will assume a thickness of from about 0.1 mil to two mils. This re-flow occurs at a temperature of from about 185 degrees Celsius (hereinafter also referred to simply as C) to about 217 degrees C., and may be accomplished within a time period of only about two to six minutes. A standard convection oven may be used for this purpose. The solder includes some flux so the re-flow procedure serves to "solder" the underlying conductor pads. Next, a layer 39 of metallic solder paste (preferably an organometallic paste) is deposited on the upper surface of the plated solder. Deposition of solder paste 39 is also preferably accomplished using a conventional screen printing operation, as used for deposition of solder 37. The deposited paste 39 is now allowed to "tack dry" for a period of about eight to twelve (e.g., ten) minutes at a temperature of about thirty-five to about forty-five (e.g., forty) degrees C. Paste layer 39 assumes a substantially domed shape (the upper surface being convex as shown in FIG. 1). As noted, layer 39 does not fully cover the conductor's upper surface, and in the particular embodiment shown, occupies from about ten to about eighty-five percent of the upper surface. This is not meant to limit the invention, however, as the paste may cover the entire upper surface.

A preferred solder paste for layer 39 is, as stated above, an organometallic solder paste, with a preferred example being sold under the product name "Conductive Paste 7001" by Ormet Circuits, Inc., having a place of business at 10070 Willow Creek Road, San Diego, Calif. ("Ormet" is a registered trademark of Ormet Circuits, Inc.) By the term "organometallic" as used herein to define such compositions is meant a solder paste containing certain metallic elements in combination with organic radicals. Other pastes are also possible, including one sold under the product name "Ablebond 8175" (formerly "Ablestik 8175") from Ablebond, Inc., having a place of business at 20021 Susana Road, Rancho Dominguez, Calif. ("Ablebond" is a registered trademark of Ablebond, Inc.), and one sold under the product name "EMS Silver Adhesive" from Electron Microscopy Sciences, having a place of business at 1560 Industry Road, Hatfield, Pa. In the above embodiment, a total of from about one to about five grams of paste 39 may be applied per conductor, with a maximum thickness within the range from about 0.1 mil to about three mils. With the paste now in position (and "tack dried"), subassembly 15 is now ready for bonding to another subassembly to form the circuitized substrate assembly in the manner defined below.

Figure 2:
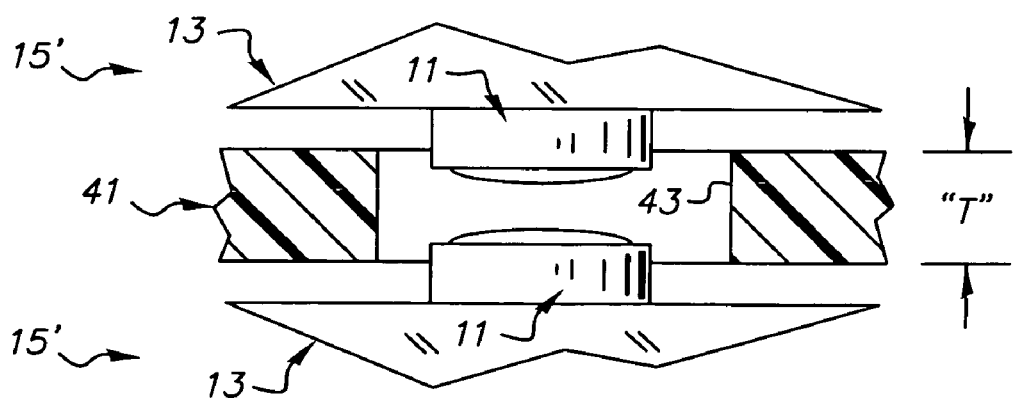
FIGS. 2-4 are side elevational views, partly in section and also on a much enlarged scale, illustrating the steps of the invention in accordance with one embodiment thereof.
Figure 3:
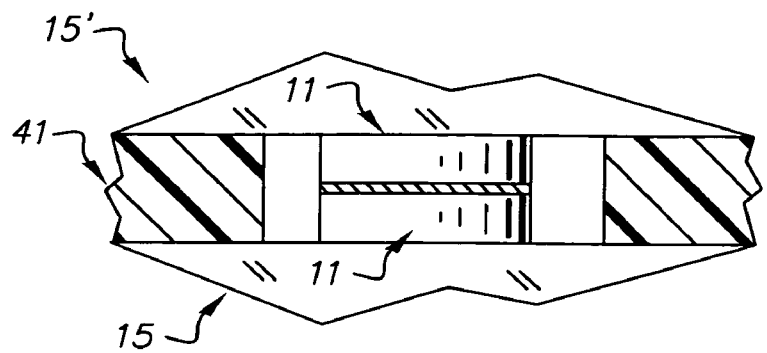
Figure 4:
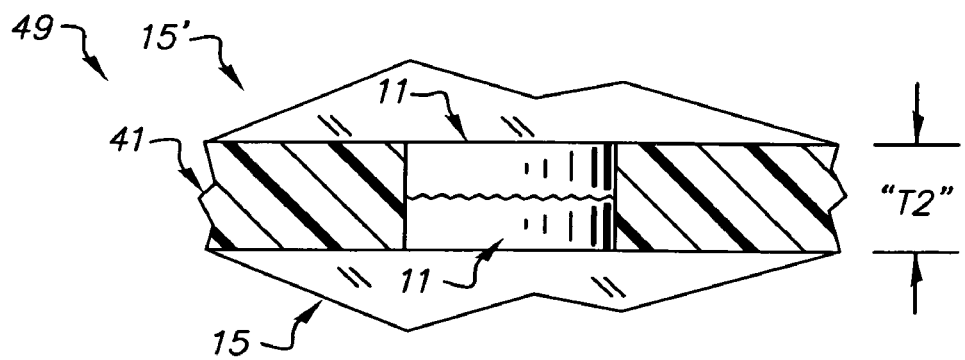

FIGS. 2-4 illustrate the steps of making a circuitized substrate assembly utilizing subassemblies such as subassembly 15 defined hereinabove. This procedure involves aligning one subassembly 15 with a second subassembly 15' (similar to subassembly 15), preferably of similar metallurgies for each of the conductors thereon. Again, only one conductor is shown per subassembly for ease of explanation but several such conductors are of course aligned and joined in the manner defined herein for the two shown. FIG. 2 represents the initial alignment orientation. A layer 41 of flowable dielectric material is positioned between both subassemblies, as shown, with this material including an opening 43 (preferably laser drilled) therein for each of the aligned pairs of conductors being bonded. As shown, opening 43 is of a larger diameter than the corresponding diameter for each conductor. In one example, with a conductor pad diameter (for the cylindrical pads) of twenty-seven mils, the corresponding opening may be from about twenty-nine to about thirty-four mils. It is also within the scope of this invention to provide openings of substantially the same diameter as the corresponding conductors. For subassemblies having conductors of the above defined metallurgies and thicknesses, the interim flowable dielectric possessed an initial thickness ("T" in FIG. 2) of from about three to about five mils. Understandably, this material will be compressed to a lesser thickness ("T2" in FIG. 4) as a result of the relatively high pressures associated with the lamination procedure used to bond the conductors. The initial thickness "T" and the chosen opening 43 diameter for layer 41 are considered critical to the teachings herein, as it is these thicknesses and opening diameters which assure that the defined mixing of metallurgies will effectively occur prior to the subsequent flowing of the dielectric and filling of the opening about the bonded conductors. It is further understood, of course, that other parameters, including the defined metals and corresponding thicknesses, as well as the precise amount of metallic solder paste utilized, account for important features of this invention.

In one embodiment, layer 41 is a "B-staged" pre-preg material, one example being Driclad dielectric material, available from Endicott Interconnect Technologies, Inc., the Assignee of this invention. ("Driclad" is a registered trademark of Endicott Interconnect Technologies, Inc.) Other dielectric materials known in the art may also be used for this purpose. By the term "flowable" as used to define these dielectric materials is meant a condition in which the material will soften and flow from its original relatively solid and rigid state, when exposed to heat at temperatures defined herein and for the periods also defined. By the term "B-staged" (or, more conventionally, "B-stage) is meant a condition of the material is which only partial cure has been achieved, and more heat and pressure are necessary to reach a fully cured (and thus hardened) condition.

The bonding of the aligned pairs of conductors 11, as stated, is accomplished through the application of heat and pressure, with a preferred approach being to utilize conventional lamination equipment. In this procedure, the two subassemblies 15 and 15' are brought together until the two outer, domed surfaces of the metallic solder pastes engage, as shown in FIG. 3. Again, it must be emphasized that paste 39 need only be applied to one of the conductors, in which case, the outer domed surface of the sole quantity of paste will directly engage the corresponding flat outer surface of the non-coated conductor. Lamination is accomplished at a pressure within the range of from about 300 pounds per square inch (PSI) to about 900 PSI for a total time period of about 120 minutes to about 250 minutes, said time period deemed to represent what may be defined as a "slow" ramp process. During this time period, the lamination temperature is raised from an initial ambient temperature of about twenty-five degrees C. to about 190 degrees C. in about forty-five minutes and held at said elevated temperature for a period of about ninety minutes. The temperature is then decreased to about three degrees C. over a time period of about 100 minutes and then to a temperature of about 100 degrees C. over a period of the remaining minutes in the total time period defined above, after which it is dropped to the initial ambient temperature. This "slow" lamination procedure is deemed successful when laminating the substrates having the dielectric material and conductive pastes defined above. Other temperatures, times and pressures will likely be required for alternative materials.

Significantly, the opposing metallurgies begin to mix at a time period of about twenty-five percent of the total time, or about twenty minutes from start-up. Pressure is continuously applied to further compress the interim, B-staged dielectric (and continues until it reaches the final compressed thickness "T2" as shown in FIG. 4). The solder paste 39, possessing the lowest melting point of the paste, interim dielectric and solder elements, begins to re-flow at approximately seventy degrees C. (between about sixty and eighty degrees C.), following which the interim dielectric begins to flow (at about 115 degrees C., or within the range of about 100 degrees C. to about 130 degrees C., above the re-flow temperature of the paste 39). Lastly, solder layer 37, having a melting point of about 185 degrees C., re-flows. This re-flow may occur within a range of about 170 degrees C. to about 220 degrees C. for solders such as that defined above for solder layer 37. At this point in the bonding procedure, the metallurgies (solder paste, solder, and copper of the base conductor 31) are mixed sufficiently that an effective bond is assured between both mating conductors in each of the pairs being bonded. Of further importance, the final approximately seventy-five percent of the mixing between metallurgies occurs simultaneously with flowing of the interim dielectric such that the dielectric substantially completely fills the opening and physically engages the conductor bond, substantially completely surrounding it as shown in FIG. 4, without adversely affecting the formation of said bond. That is, portions of the flowed dielectric do not flow into the metallurgies themselves, or between parts thereof.

The desired electrical connections being now formed, the two subassemblies 15 and 15' are now allowed to cool to ambient temperature and a bonded, multilayered circuitized substrate assembly 49 has been effectively produced. The following chart is provided as one example of the approximate relative time periods, pressures and temperatures at the corresponding stages of the lamination process, using the above metallurgies. The times are cumulative.

| STAGE: | TEMP (Deg. C.): | PRESSURE (PSI): | TIME (Min.): |
| --- | --- | --- | --- |
| A. Conductors apart | 25 | 500 | 10 |
| B. Initial conductor engagement | 70 | 500 | 20 |
| C. Initial conductor Intermixing | 190 | 500 | 45 |
| D. 25% conductor mix and initial dielectric flow | 190 | 500 | 50 |
| E. 50% conductor mix | 190 | 500 | 65 |
| F. 100% conductor mix and complete dielectric flow to fill opening | 190 | 500 | 70 |
| G. Assembly cooled to ambient temperature | | | 240 |

This chart is not meant to limit the scope of the present invention. As mentioned, differing times and pressures may apply as different metallurgies and the corresponding thicknesses thereof are utilized. For example, it is within the scope of this invention for the metallurgies of both conductors to achieve complete mixing prior to the complete filling of the opening and physical engagement with the bond. The key, of course, is to prevent the possible incursion of dielectric material within the mixing metallurgies, which would adversely affect the resulting bond, prior to completion of said bond. The present invention is able to attain this in an unobvious manner, using the steps, thicknesses and materials defined herein.

Figure 5:
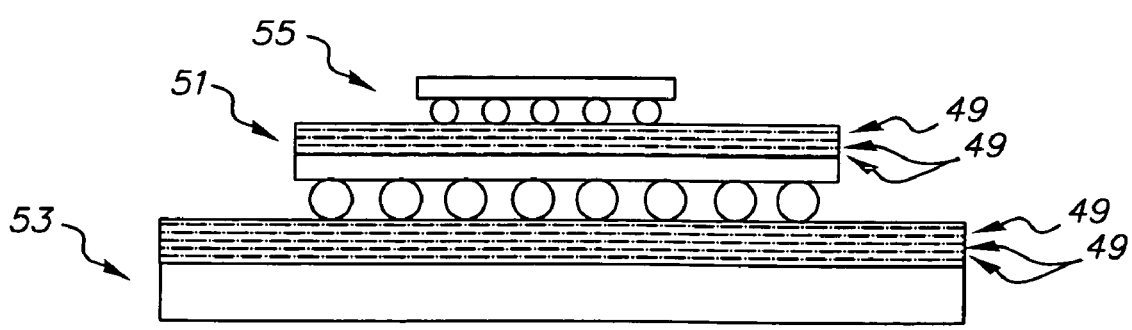
FIG. 5 is a side elevational view, on a smaller scale than FIGS. 1-4, illustrating two electrical assemblies each of which are capable of utilizing one or more of the circuitized substrate assemblies of the instant invention.

FIG. 5 represents two examples of multilayered circuitized substrate assemblies 51 and 53 which may be produced using the teachings of the invention. Assembly 51 represents a chip carrier while assembly 53 represents a printed circuit board. The board is adapted for having one or more chip carriers positioned thereon and electrically coupled thereto, as is known in the art. The carrier is adapted for having one or more electrical components 55 (only one shown) such as a semiconductor chip mounted thereon and electrically coupled thereto. The carrier is able to hold more than one chip if desired. The resulting structure as shown in FIG. 5 thus provides a means whereby the chip (or chips) mounted on the carrier are capable of being electrically to other components and circuit structure through the host board, assembly 53. One example of a host for such components and structures (and for the assemblies shown in FIG. 5) is an information handling system, e.g., a personal computer, computer mainframe or computer server. Others information handling systems are also known which could accommodate the unique circuitized substrate assemblies taught herein, and further description is not considered necessary. The structure shown in FIG. 5, including assemblies 51 and 53, and chip 55, is understood to constitute an electrical assembly as defined above. In it simplest form, assembly 51 and chip 55 also represent an electrical assembly according to the above definition. As seen in FIG. 5, each assembly 51 and 53 may comprise a plurality of subassemblies as part thereof. By way of example, each is shown to include three assemblies 49. Each assembly may also further include thru-holes (not shown) as part thereof. Such thru-holes are preferred in assemblies of the complex nature defined herein. In one example, as many as 10,000 (and perhaps more, if desired) such thru-holes may be utilized per assembly.

The two substrate assemblies shown in FIG. 5 are representative only and not meant to limit the invention. It is within the scope of this invention to combine several additional substrate subassemblies to form one or more such assemblies, as represented by the drawing which allows for others to be added and combined with the three assemblies depicted.

Thus there has been shown and described a circuitized substrate assembly in which highly effective electrical connections are possible through the use of bonded conductor members and metallic conductive pastes of circuitized substrate subassemblies which form the final assembly. Various embodiments of such subassemblies may be combined together to form the larger, multilayered substrate assembly which can be utilized in such electronic structures as information handling systems. Such systems are thus able to benefit by the unique, advantageous features of this invention.

While there have been shown and described what are at present considered the preferred embodiments of the invention, it will be obvious to those skilled in the art that various changes and modifications may be made therein without departing from the scope of the invention as defined by the appended claims. The assemblies as produced herein are capable of transmitting both regular and high speed (frequency) signals, the latter at a rate of from about one Gigabits/sec to about ten Gigabits/second (or even more), while substantially preventing impedance disruption. The method as defined herein is also capable of being implemented using many conventional PCB processes so as to assure reduced cost and facilitate ease of manufacture. That is, the preferred method for assembling the circuitized substrate assemblies of the invention preferably involves the use of conventional lamination processes as part of the method in which the subassemblies, having the designated circuitry and/or conductive elements (planes) thereon (and possibly within), are "stacked up" in aligned manner with one another and subjected to relatively high pressures and temperatures for the defined time periods.

What is claimed is:

1. A method of making a circuitized substrate assembly comprising:

providing first and second circuitized substrate subassemblies, each of said circuitized substrate subassemblies including at least one dielectric layer and at least one conductive layer including a plurality of metallic conductor pads as part thereof;

aligning said first and second circuitized substrate subassemblies relative to one another such that each of said plurality of metallic conductor pads of said first circuitized substrate subassembly are aligned with a corresponding metallic conductor pad of said plurality of metallic conductor pads of said second circuitized substrate subassembly in a facing manner;

positioning a flowable dielectric layer between said first and second circuitized substrate subassemblies, said dielectric layer including a plurality of openings therein, each of said openings aligning with a respective pair of aligned and facing metallic conductor pads of said first and second circuitized substrate subassemblies;

depositing a quantity of metallic solder paste on one of said metallic conductor pads of each of said pairs of said aligned and facing metallic conductor pads of said first and second circuitized substrate subassemblies;

depositing a quantity of organometallic solder paste by screen or stencil printing on the remaining one of said metallic conductor pads of each of said pairs of said conductive pads, said organometallic solder paste having a composition different from the composition of said metallic paste; and bonding said first and second circuitized substrate subassemblies together using heat and pressure in such a manner that the metallurgies of said metallic and organometallic solder paste and said metallic conductor pads in said pairs of said aligned and facing metallic conductor pads of said first and second circuitized substrate subassemblies are combined to form an electrical connection therebetween and the material of said flowable dielectric layer will flow into said openings to substantially fill said openings and physically contact and surround said electrical connections without adversely affecting said electrical connections.

2. The method of claim 1 further including flowing said quantities of solder paste after said depositing of said quantities thereof on said at least one of said metallic conductor pads of each of said pairs of said aligned and facing metallic conductor pads of said first and second circuitized substrate subassemblies.

3. The method of claim 2 wherein said flowing of said quantities of solder paste occurs during said bonding of said first and second circuitized substrate subassemblies together using said heat and pressure.

4. The method of claim 3 wherein said flowing of said quantities of solder paste occurs at a temperature less than the temperature reached to cause said flowable dielectric layer will flow into said openings to substantially fill said openings and physically contact and surround said electrical connections without adversely affecting said electrical connections.

5. The method of claim 4 wherein said temperature at said flowing of said organometallic solder paste is within the range of from about sixty degrees C. to about eighty degrees C. and said temperature reached to cause said flowable dielectric layer to flow into said openings to substantially fill said openings and physically contact and surround said electrical connections without adversely affecting said electrical connections is within the range of from about 100 degrees C. to about 130 degrees C.

6. The method of claim 1 wherein each of said metallic conductor pads of said plurality of metallic conductor pads of said second circuitized substrate subassemblies comprises a first metal and at least one second metal different from said first metal.

7. The method of claim 6 wherein said second metal is plated onto said first metal of each of said metallic conductor pads of said plurality of metallic conductor pads of said first and second circuitized substrate subassemblies.

8. The method of claim 7 wherein said first metal is copper or copper alloy and said second metal is nickel and/or gold.

9. The method of claim 1 wherein said organometallic solder paste is allowed to tack dry prior to said bonding of said first and second circuitized substrate subassemblies together.

10. The method of claim 9 wherein said tack drying of said organometallic solder paste is accomplished by heating said organometallic solder paste to a predetermined temperature for an established time period.

11. The method of claim 10 wherein said predetermined temperature is from about thirty-five to about forty-five degrees C. and said established time period is from about eight to twelve minutes.

12. The method of claim 1 wherein said bonding of said first and second circuitized substrate subassemblies together using said heat and pressure occurs for a time period of from about 120 minutes to about 250 minutes.

13. The method of claim 12 wherein said heat during said bonding is at a temperature within the range of from about 170 degrees C. to about 220 degrees C. and said pressure is within the range of from about 300 PSI to about 900 PSI.

14. The method of claim 1 wherein each of said metallic conductor pads is provided with a substantially flat upper surface and said solder pastes are deposited on said substantially flat upper surfaces and form a substantially domed configuration.

15. The method of claim 14 wherein each of said quantities of solder paste deposited in said substantially domed configuration cover only a portion of each of said substantially flat upper surfaces of said metallic conductor pads.

16. The method of claim 1 wherein said flowable dielectric layer comprises a B-staged pre-preg material.

17. The method of claim 1 wherein said metallic conductor pads of each of said pairs of said aligned and facing metallic conductor pads of said first and second circuitized substrate subassemblies include a solder layer thereon, said metallic solder paste flowing at a first temperature, said flowable dielectric layer between said first and second circuitized substrate subassemblies flowing at a second temperature greater than said first temperature, and said solder of said solder layer flowing at a third temperature greater than said second temperature.

18. The method of claim 1 wherein said metallic solder paste is reflowed before depositing said quantity of organometallic solder paste.

* * * * *